United States Patent [19]

Ogino

[11] Patent Number: 5,285,464
[45] Date of Patent: Feb. 8, 1994

[54] DRIVING APPARATUS OF A LASER DIODE

[75] Inventor: Shigeo Ogino, Toyokawa, Japan

[73] Assignee: Minolta Camera Kabushiki Kaisha, Osaka, Japan

[21] Appl. No.: 944,663

[22] Filed: Sep. 14, 1992

[30] Foreign Application Priority Data

Sep. 18, 1991 [JP] Japan .................................. 3-268443

[51] Int. Cl.$^5$ .............................................. H01S 3/00
[52] U.S. Cl. ................................................. 372/38
[58] Field of Search ............................. 372/38, 26, 31

[56] References Cited

U.S. PATENT DOCUMENTS

| | | | |
|---|---|---|---|
| 4,734,914 | 3/1988 | Yoshikawa | 372/38 |
| 4,813,048 | 3/1989 | Yamane et al. | 372/38 |
| 5,050,177 | 9/1991 | Ema | 372/38 |
| 5,068,545 | 11/1991 | Molnar | 372/38 |
| 5,115,147 | 5/1992 | Kusano et al. | 372/38 |
| 5,163,063 | 11/1992 | Yoshikawa et al. | 372/38 |
| 5,182,756 | 1/1993 | Waki et al. | 372/38 |

*Primary Examiner*—Rodney B. Bovernick
*Assistant Examiner*—Robert E. Wise
*Attorney, Agent, or Firm*—Price, Gess & Ubell

[57] ABSTRACT

Disclosed is a driving apparatus of a laser diode, comprising a light detection circuit serial-connected with a pin diode detecting the intensity of the emission of light from the laser diode, the light detection circuit producing a signal depending on the intensity of the emission detected by the pin diode, a modulation circuit serial-connected with the laser diode, the output current of the modulation circuit varying depending on the difference between an input signal and the signal outputted from the light detection circuit, and a constant voltage drop device disposed in the series circuit including the laser diode and the modulation circuit, the constant voltage drop device causing a voltage drop of a certain degree regardless of the strength of a current flowing thereto. A Zener diode having Zener voltage equivalent to the dropped constant voltage or having at least one diode which generates forward voltage drop equivalent to the dropped constant voltage or the like is used as the above constant voltage drop device, the device being disposed, for example, between the laser diode and the modulation circuit.

15 Claims, 3 Drawing Sheets

DRIVING APPARATUS OF A LASER DIODE

BACKGROUND OF THE INVENTION

1) Field of the Invention

This invention relates to a driving apparatus of a laser diode used as a light source of a laser printer and the like.

2) Related Arts

A conventional driving apparatus of a laser diode is disclosed in U.S. Pat. No. 4,625 315. A common laser diode unit is composed of a laser diode and a pin diode, such as the one shown in FIG. 1. In the figure, a laser diode LD and a pin diode PD, which is to monitor the intensity of light emitted by the laser diode LD, are built into a laser diode unit LDU. A cathode terminal TLC of the laser diode LD and an anode terminal TPA of the pin diode PD are drawn from the laser diode unit LDU. An anode terminal of the laser diode LD and a cathode terminal of the pin diode PD are connected to be made into a common terminal TCM, and drawn from the laser diode unit LCU. The common terminal TCM is generally impressed with positive voltage of about 5 volts (the reason the voltage is about 5 volts will be described later).

A driving apparatus 1 is composed of a constant current unit 11, which keeps the current constant, a modulation unit 12, which sends an alternating current IAC modulating depending on an input signal, and a detection unit 13, which outputs a feedback signal to stabilize the light emitted from the laser diode LD.

The constant current unit 11 and the modulation unit 12 are connected in parallel, their junction P1 and the cathode terminal TLC of the laser diode LD being directly connected.

The modulation unit 12 is provided with a buffer amplifier 32 whose output voltage modulates between positive and negative depending on an input signal, a resistor R1 to adjust the strength of the current being connected between an output terminal of the buffer amplifier 32 and the junction P1. The constant current unit 11 sends a direct current IDC having, for example, about half strength of the maximum laser current ILD, both the direct current IDC and the alternating current IAC of the modulation unit 12 being synthesized, and then sent to the laser diode LD.

The detection unit 13 amplifies voltage across a variable resistor 41 by the use of an amplifier 42 with an appropriate amplification gain, the voltage being generated by a current sent through the pin diode PD. The output voltage is inputted to a differential amplifier 31 as a feedback signal S2.

The above-mentioned driving apparatus, however, has a difficulty of improving responsibility of the pin diode PD. The higher a reverse bias voltage impressed on the pin diode is, the more improved the responsibility is. However, the conventional driving apparatus demands restricting voltage at the cathode terminal TLC as low as several volts depending on the characteristics of the constant current unit 11 and the modulation unit 12. In addition, voltage between both ends of the laser diode LD is almost constant. As a result, the common terminal TCM can only be impressed as a low voltage of 5 volts.

SUMMARY OF THE INVENTION

The object of this invention is to provide a laser diode driving apparatus which can improve high responsibility of a pin diode by strengthening reverse bias voltage impressed thereon.

The above object can be achieved by a driving apparatus of a laser diode, comprising a light detection circuit serial-connected with a pin diode detecting the intensity of the emission of light from the laser diode, the light detection circuit producing a signal depending on the intensity of the emission detected by the pin diode, a modulation circuit serial-connected with the laser diode, the output current of the modulation circuit varying depending on the difference between an input signal and the signal outputted from the light detection circuit, and a constant voltage drop device disposed in the series circuit including the laser diode and the modulation circuit, the constant voltage drop device causing a voltage drop of a certain degree regardless of the strength of a current flowing thereto.

A Zener diode having Zener voltage equivalent to the dropped constant voltage or having at least one diode which generates a forward voltage drop equivalent to the dropped constant voltage, or the like is used as the above constant voltage drop device, the device being disposed, for example, between the laser diode and the modulation circuit.

According to the above construction, the reverse bias voltage impressed on the pin diode can be intensified without any restrictions caused by characteristics of the modulation circuit or the like. As a result, the responsibility of the pin diode can be easily improved.

The above object can be achieved also by a driving apparatus of a laser diode, comprising a modulation circuit composing a first series circuit by being connected to the cathode of a laser diode, and controlling a current flowing to the laser diode and a light detection circuit composing a second series circuit by being connected to the anode of a pin diode, and outputting a feedback signal depending on the intensity of the emission of light from the laser diode, to the modulation circuit, wherein the modulation circuit is driven by a plus power source and a minus power source both connected therewith, the plus power source is further connected with the anode of the laser diode and the cathode of the pin diode, and the minus power source is further connected with a terminal of the second series circuit on the side opposite to the pin diode.

According to the above construction in which the minus power source connected with a terminal of the second series circuit on the side opposite to the pin diode, the reverse bias voltage impressed on the pin diode can be intensified and the responsibility of the pin diode can be easily improved even if the voltage impressed on the anode of the laser diode and the cathode of the pin diode is both lowered.

BRIEF DESCRIPTION OF THE DRAWINGS

These and other objects, advantages and features of the invention will become apparent from the following description thereof taken in conjunction with the accompanying drawings which illustrate a specific embodiment of the invention. In the drawings.

DESCRIPTION OF THE PREFERRED EMBODIMENT

Figure 1:
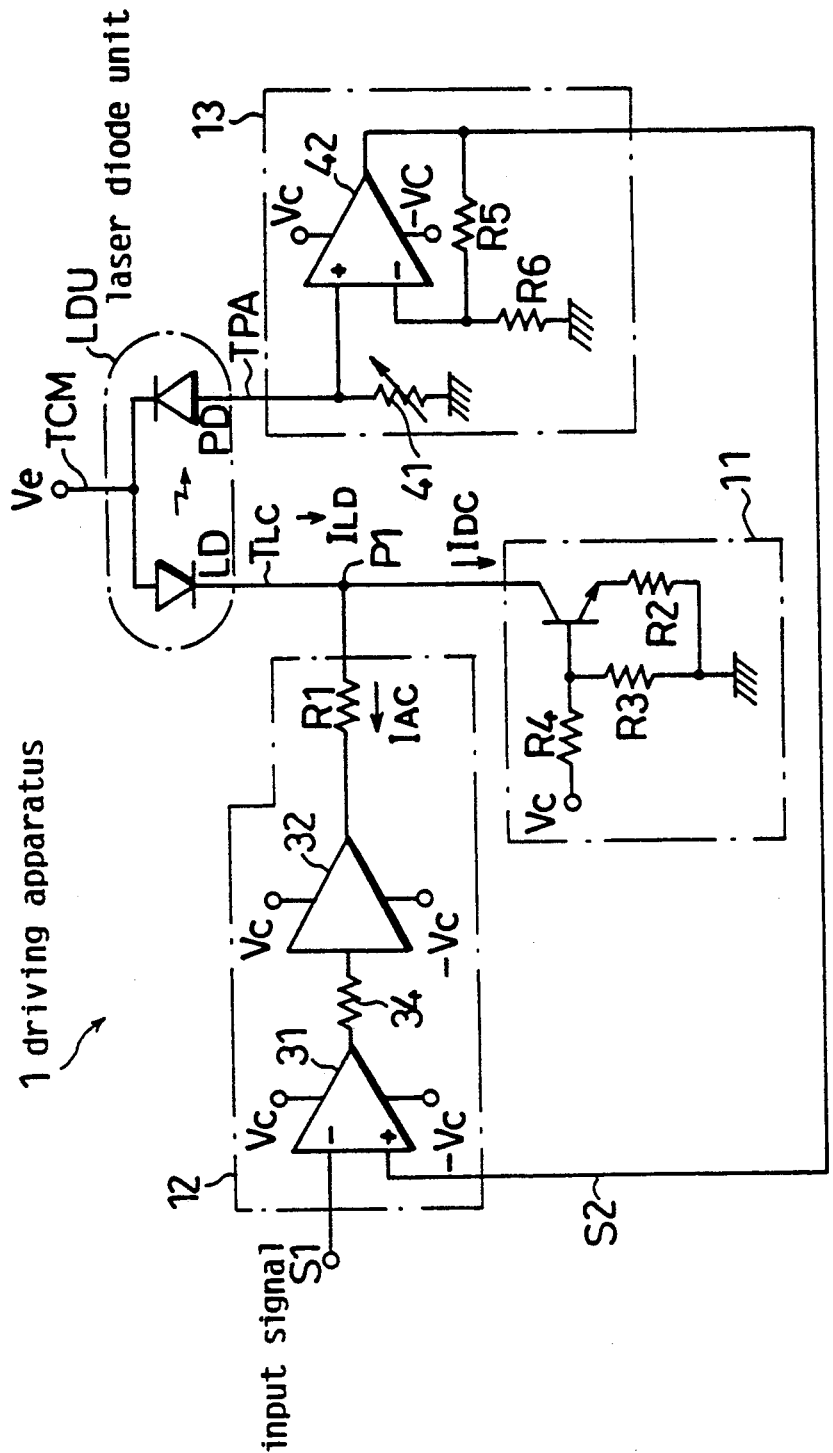
FIG. 1 is a circuit diagram showing a laser diode driving apparatus of the related arts.
Figure 2:
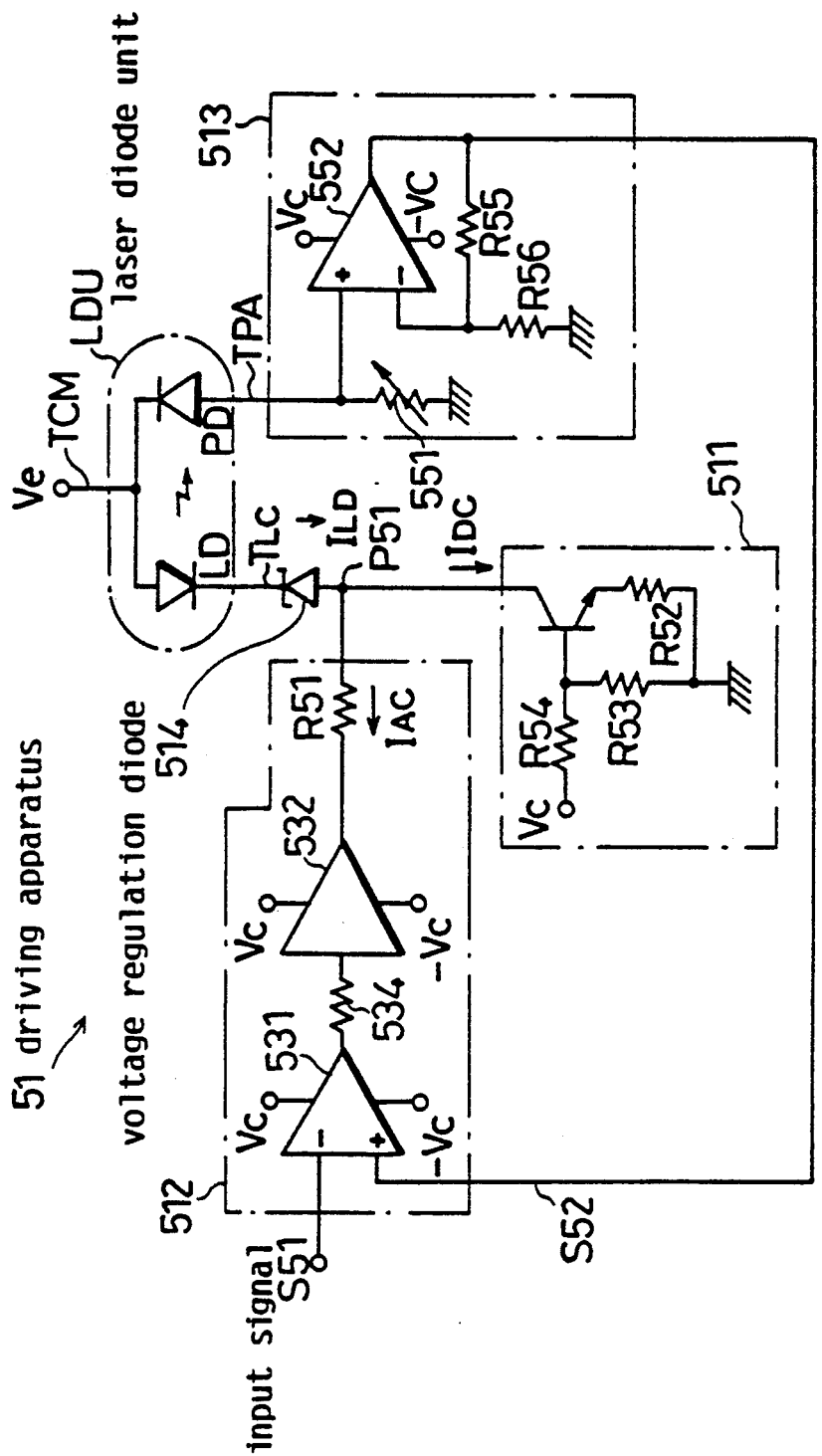
FIG. 2 is a circuit diagram showing a laser diode driving apparatus of an embodiment of this invention.

A driving apparatus 51 shown in FIG. 2 differs from the one described in the Related Arts mainly in comprising a voltage regulation diode 514 such as a Zener diode.

In FIG. 2, a laser diode LD and a pin diode PD, which is to monitor the intensity of light emitted by the laser diode LD are built into a laser diode unit LDU. A cathode terminal TLC of the laser diode LD and an anode terminal TPA of the pin diode PD are drawn from the laser diode unit LDU. An anode terminal of the laser diode LD and a cathode terminal of the pin diode PD are connected to be made into a common terminal TCM, and drawn from the laser diode unit LDU.

A driving apparatus 51 is composed of a constant current unit 511, which keeps the current constant, a modulation unit 512, which sends an alternating current IAC modulating depending on an input signal (the forward direction is indicated by an arrow in the figure), and a detection unit 513, which outputs a feedback signal to stabilize the light emitted from the laser diode LD.

The constant current unit 511 and the modulation unit 512 are connected at their junction P51, the voltage regulation diode 514 being further connected between the junction P51 and the cathode terminal TLC of the laser diode LD.

The modulation unit 512 is composed of a differential amplifier 531 whose output voltage modulates between positive and negative depending on both an input signal S51 and a feedback signal S52, which is outputted from the detection unit 513, a buffer amplifier 532 operating as a current buffer, a resistor 534 to connect them both, and a resister R51 to restrict the strength of a current. The differential amplifier 531 and the buffer amplifier 532 are impressed $\pm 12$ volts of voltage Vc and $-Vc$ respectively as power sources for operation. An output terminal of the buffer amplifier 532 outputs voltage of about $\pm 10$ volts as its maximum depending on the input signal S51 and the feedback signal S52.

The detection unit 513 amplifies voltage across a variable resistor 551 by the use of an amplifier 552 with an appropriate amplification gain, the voltage being generated by a current sent through the pin diode PD. The output voltage is inputted to a differential amplifier 531 as a feedback signal S52. The voltage regulation diode 514 serves to control the voltage at the junction P51 to be lower than the voltage of the cathode terminal TLC of the laser diode LD by a certain degree. Used in this embodiment as such a diode is the one generating about 10 volt shift voltage (dropped voltage) Vs.

The common terminal TCM of the laser diode LD is impressed with a 12 volt voltage Ve through the same power source line as the one through which the voltage Vc is supplied to the buffer amplifier 532 and the like.

Provided that the proper range of the laser current ILD sent to the laser diode LD is about 10 mA-100 mA, the constant current unit 511 is constructed so that the direct current IDC, which flows through the unit 511 can be about 50 mA. Resistance value of the resistor R51 in the modulation unit 512 is set so that an about $\pm 48$ mA current can be sent when the output voltage of the buffer amplifier 532 is $\pm 10$ volts.

The following is a description of the operation of the driving apparatus 51 thus constructed.

In accordance with the variation of the input signal S51 between the maximum and the minimum values, the voltage outputted from the buffer amplifier 532 varies between $\pm 10$ volts as mentioned above.

On the other hand, the forward voltage drop of the laser diode LD is generally about 2 volts and the shift voltage Vs of the voltage regulation diode 514 is 10 volts; the voltage VP51 at the junction P51 becomes almost 0 volt $(12-2-10=0)$.

Since the strength of the alternating current IAC sent to the resistor R51 varies depending on the difference between the voltage outputted from the buffer amplifier 532 and the voltage VP51 at the junction P51, both absolute values of the positive voltage and the negative voltage of the alternating current IAC becomes substantially equal.

Thus, the range of driving current of the laser diode LD can be extended by optimizing the operating range of the buffer amplifier 532.

A laser current ILD, which is equivalent to the sum of the alternating current IAC and the direct current IDC that flows through the constant current unit 511, flows through the laser diode LD. For example, if as much as 48 mA alternating current IAC flows both in the delivery direction (negative direction) and the suction direction (positive direction), 50 mA direct current IDC and the alternating current are synthesized so that 2 mA-98 mA laser current ILD flows.

If the minimum current is as low as 2 mA, the intensity of the light emitted from the laser diode LD is sufficiently lowered. Therefore, if the laser diode LD is used as an exposing light source of a printer, the occurrence of black fog on prints outputted can be prevented. On the other hand, if the maximum current is 98 mA, it is both very close to and does not exceed the maximum of the proper current of the laser diode LD, 100 mA, so that the maximum output can be obtained without destroying the laser diode LD.

These advantages are gained by the condition that the voltage VP51 at the junction P51 is substantially 0 volt. Nevertheless, because the voltage regulation diode 514 is provided to the laser diode unit, the common terminal TCM of the laser diode LD can be impressed with a high voltage of 12 volts, which is higher by the shift voltage Vs.

As a result, the pin diode PD is impressed with a voltage as high as 12 volt reverse bias voltage, having high responsibility and high frequency characteristics.

Moreover, setting the shift voltage Vs of the voltage regulation diode 514 as above realizes sharing the voltage impressed on the common terminal TCM with other power source lines, thereby saving a dedicated power source and wiring to reduce the cost.

Although the voltage VP51 at the junction P51 is set to be substantial 0 in the above embodiment, it may be set according to the circuit construction or specification of the constant current unit 511, the modulation unit 512, the detection unit 513, the voltage regulation diode 514 or another unit. For example, if the constant current unit 511 and the modulation unit 512 are constructed to properly operate when the voltage at the junction P51 is about 3 volts, the voltage VP51 can be made 3 volts by using the voltage regulation diode 514 whose shift voltage Vs is about 7 volts.

Although the voltage regulation diode 514 is used as a voltage shift element in the embodiment, a number of diodes may be serial-connected in a forward direction so that the sum of the forward voltage drop can be predetermined shift voltage Vs. Also, various elements or circuits can be used.

Figure 3:
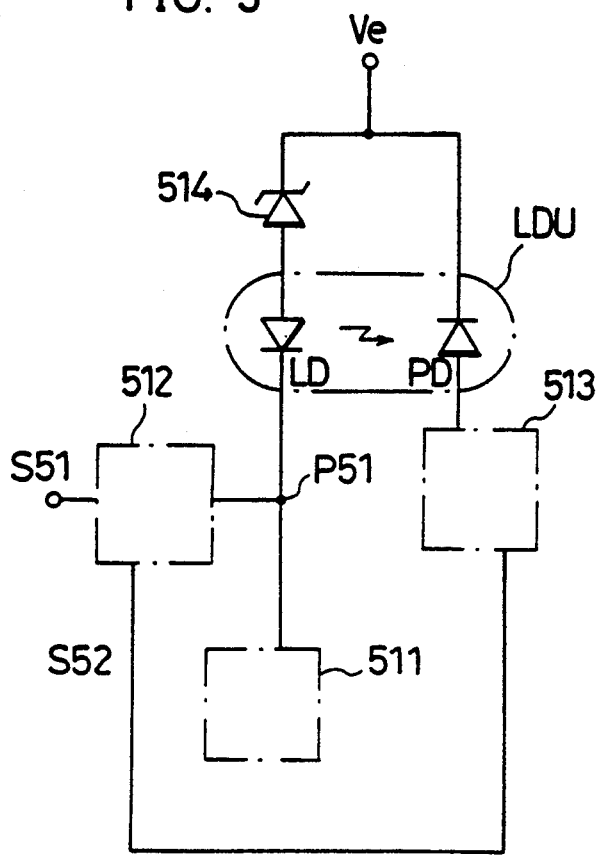
FIG. 3 is a circuit diagram showing a laser diode driving apparatus of another embodiment of this invention.

Moreover, an anode terminal of the laser diode LD and a cathode terminal of the pin diode PD may be drawn from the laser diode unit LDU separately. In that case, as shown in FIG. 3, the voltage regulation diode 514 can be connected with the anode terminal of the laser diode LD.

Figure 4:
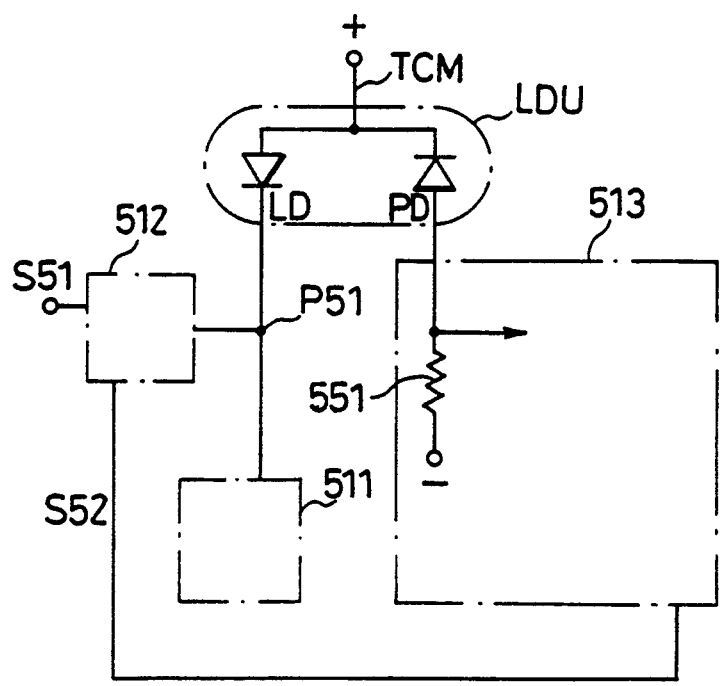
FIG. 4 is a circuit diagram showing a laser diode driving apparatus of further another embodiment of the same.

Furthermore, instead of or in addition to providing the voltage regulation diode 514 in the pass of the current, which flows through the laser diode LD, the electric potential of the terminal on either side of the variable resistor 551 may be shifted to the negative as shown in FIG. 4. In that case, the electric potential at the junction P51 can be restricted by lowering the voltage given to the common terminal TCM, while the reverse bias voltage impressed on the pin diode PD can be strengthened. Using a power source which is identical with the one used for the amplifier 552 or the like for the negative shifting can save the necessity of providing another power source circuit like the case of providing the voltage regulation diode 514.

Moreover, there is no need of providing the constant current unit 511 in such a case that the modulation unit 512 has a sufficient driving capacity.

Furthermore, for the purpose of improving the frequency characteristics of the driving apparatus 51, a capacitor having predetermined impedance may be provided to each unit of the constant current unit 511, the modulation unit 512, and/or the detection unit 513.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. A driving apparatus of a laser diode, comprising:
   a light detection circuit serial-connected with a pin diode detecting the intensity of the emission of light from the laser diode, said light detection circuit producing a signal depending on the intensity of the emission detected by the pin diode;
   a modulation circuit serial-connected with the laser diode the output current of said modulation circuit varying depending on the difference between an input signal and said signal outputted from the light detection circuit; and
   constant voltage drop means disposed in the series circuit including the laser diode and the modulation circuit, the constant voltage drop means causing a voltage drop of a certain degree regardless of the strength of a current flowing thereto.

2. A driving apparatus of claim 1, wherein the constant voltage drop means is a Zener diode having Zener voltage equivalent to the dropped voltage.

3. A driving apparatus of claim 1, wherein the constant voltage drop means is at least one diode generating a forward voltage drop equivalent to the dropped voltage.

4. A driving apparatus of claim 1, wherein the constant voltage drop means is disposed between the laser diode and the modulation circuit.

5. A driving apparatus of claim 4, wherein predetermined identical electric potential is given to a terminal of the laser diode on the side opposite to the modulation circuit and to a terminal of the pin diode on the side opposite to the light detection circuit.

6. A driving apparatus of claim 5, wherein the laser diode and the pin diode compose a laser diode unit having a common terminal into which said terminal of the laser diode on the side opposite to the modulation circuit and said terminal of the pin diode on the side opposite to the light detection circuit are connected to be made, the predetermined identical electric potential being given to said common terminal.

7. A driving apparatus of claim 6, wherein the anode of the laser diode and the cathode of the pin diode are connected to be made into the common terminal.

8. A driving apparatus of claim 1, wherein the modulation circuit includes an amplifier which generates voltage depending on the difference between said input signal and said output signal of the light detection circuit, and resistance which sends a current depending on the voltage generated.

9. A driving apparatus of claim 1, further comprising:
   a constant current circuit, which sends a constant current having about half strength of the maximum current driving the laser diode, wherein the modulation circuit sends both forward and backward currents whose absolute values are smaller than that of the constant current, and a current into which the current from the constant current circuit and the current from the modulation circuit are synthesized are sent to the laser diode.

10. A driving apparatus of claim 9, wherein the dropped voltage generated by the constant voltage drop means is set so that the electric potential of the junction of the modulation circuit and the constant current circuit can be substantially 0 volt.

11. A driving apparatus of claim 1, wherein the light detection circuit includes resistance connected to the pin diode and outputs a signal depending on the electric potential of the junction of the pin diode and the resistance.

12. A driving apparatus of a laser diode, comprising:
   a modulation circuit composing a first series circuit by being connected to the cathode of a laser diode, and controlling a current flowing to the laser diode; and
   a light detection circuit composing a second series circuit by being connected to the anode of a pin diode, and outputting a feedback signal depending on the intensity of the emission of light from the laser diode, to the modulation circuit,
   wherein the modulation circuit is driven by a plus power source and a minus power source both connected therewith, the plus power source is further connected with the anode of the laser diode and the cathode of the pin diode, and the minus power source is further connected with a terminal of the second series circuit on the side opposite the pin diode,
   wherein the laser diode and the pin diode comprise a laser diode unit having a common terminal into which said anode of the laser diode and said cathode of the pin diode are connected, the plus power source being connected to the common terminal.

13. A driving apparatus of a laser diode, comprising:
a modulation circuit composing a first series circuit by being connected to the cathode of a laser diode, and controlling a current flowing to the laser diode;
a light detection circuit composing a second series circuit by being connected to the anode of a pin diode, and outputting a feedback signal depending on the intensity of the emission of light from the laser diode, to the modulation circuit, wherein the modulation circuit is driven by a plus power source and a minus power source both connected therewith, the plus power source is further connected with the anode of the laser diode and the cathode of the pin diode, and the minus power source is further connected with a terminal of the second series circuit on the side opposite the pin diode; and
a constant current circuit, which sends a constant current having about half the strength of the maximum current driving the laser diode, wherein the modulation circuit sends both forward and backward currents whose absolute values are smaller than that of the constant current, and a current into which the current from the constant current circuit and the current from the modulation circuit are synthesized are sent to the laser diode.

14. A driving apparatus of a laser diode; comprising:
a laser diode unit including a laser diode and a pin diode;
a power source for supplying a predetermined voltage to an anode of said laser diode and a cathode of said pin diode;
a light detection circuit serially connected with said pin diode and detecting the intensity of the emission of light from the laser diode, said light detection circuit producing a signal depending on the intensity of the emission detected by the pin diode;
a modulation circuit serially connected with the laser diode and outputting current depending on the difference between an input signal and said signal outputted from said light detection circuit; and
constant voltage drop means for causing a voltage drop of a certain degree regardless of the strength of a current flowing thereto, said constant voltage drop means disposed between said power source and said modulation circuit.

15. A driving apparatus of a laser diode, comprising:
a laser diode unit including a laser diode and a pin diode;
first power source for supplying a predetermined voltage to an anode of said laser diode and a cathode of said pin diode;
a modulation circuit including a first series circuitry by being connected to the cathode of a laser diode, and controlling a current flowing to the laser diode;
a light detection circuit including a second series circuit by being connected to the anode of a pin diode, and outputting a feedback signal depending on the intensity of the emission of light from the laser diode to the modulation circuit; and
a second power source for supplying a voltage of the opposite polarity to said predetermined voltage supplied by said first power source to the anode of the pin anode.

* * * * *